(12) United States Patent
Zhu

(10) Patent No.: US 6,915,152 B2
(45) Date of Patent: Jul. 5, 2005

(54) METHOD FOR MR IMAGING WITH AN ARRAY OF RF COILS

(75) Inventor: Yudong Zhu, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 742 days.

(21) Appl. No.: 09/838,634

(22) Filed: Apr. 19, 2001

(65) Prior Publication Data

US 2003/0004410 A1 Jan. 2, 2003

(51) Int. Cl.$^7$ .............................. A61B 5/05; G01V 3/00
(52) U.S. Cl. ..................... 600/422; 600/410; 324/307
(58) Field of Search ................. 600/422, 420, 600/431, 435, 436, 421, 423; 250/30 R; 324/366, 307, 308, 309, 318

(56) References Cited

U.S. PATENT DOCUMENTS

| | | | | |
|---|---|---|---|---|
| 3,622,869 A | * | 11/1971 | Golay | 324/320 |
| 4,825,162 A | | 4/1989 | Roemer et al. | 324/318 |
| 5,910,728 A | | 6/1999 | Sodickson | 324/309 |
| 6,088,611 A | * | 7/2000 | Lauterbur et al. | 600/407 |
| 6,526,306 B2 | * | 2/2003 | Johnson et al. | 600/411 |
| 6,544,181 B1 | * | 4/2003 | Buck et al. | 600/455 |
| 6,650,925 B2 | * | 11/2003 | Wang | 600/410 |

OTHER PUBLICATIONS

Daniel K. Sodickson, WJ. Manning., "Simultaneous Acquisition of Spatial Harmonics (SMASH): Fast Imaging With Radiofrequency Coil Arrays", MRM 38:591–603 (1997).

Klaas P. Pruessmann, M. Weiger, MB Scheidegger, P. Boesiger, "SENSE: Sensitivity Encoding for Fast MRI", Institute of Biomedical Engineering and Medical Informatics, Univ. of Zurich and Swiss Federal Institute of Tech. Zurich, Switzerland, Jul. 9, 1999.

Ingrid Daubechies, "The Wavelet Transform, Time–Frequency Localization and Signal Analysis", IEEE Transactions on Information Theory, vol., 36, No. 5, Sep. 1990.

* cited by examiner

*Primary Examiner*—Daniel Robinson
(74) *Attorney, Agent, or Firm*—Jean K. Testa; Patrick K. Patnode

(57) ABSTRACT

A method and apparatus for producing an image of a region of interest using a Magnet Resonance Imaging (MRI) system comprises the steps of acquiring a plurality of under-sampled MR data sets from a plurality of radiofrequency (RF) coils forming an array and combining the plurality of under-sampled MR data sets to produce the image. Each of the RF coils has a non-uniform sensitivity.

10 Claims, 8 Drawing Sheets

$$A = \begin{bmatrix} w(z-(-R)\Delta_z) & w(z-(-R+1)\Delta_z) & \cdots & w(z-R\Delta_z) \\ w(z-(-R)\Delta_z - P/\Delta_{kz})e^{-j2\pi\varepsilon} & w(z-(-R+1)\Delta_z - P/\Delta_{kz})e^{-j2\pi\varepsilon} & \cdots & w(z-R\Delta_z - P/\Delta_{kz})e^{-j2\pi\varepsilon^P} \\ \cdots & & & \\ w(z-(-R)\Delta_z - 1/\Delta_{kz})e^{-j2\pi\varepsilon} & w(z-(-R+1)\Delta_z - 1/\Delta_{kz})e^{-j2\pi\varepsilon} & \cdots & w(z-R\Delta_z - 1/\Delta_{kz})e^{-j2\pi\varepsilon} \\ w(z-(-R)\Delta_z + 1/\Delta_{kz})e^{+j2\pi\varepsilon} & w(z-(-R+1)\Delta_z + 1/\Delta_{kz})e^{+j2\pi\varepsilon} & \cdots & w(z-R\Delta_z + 1/\Delta_{kz})e^{+j2\pi\varepsilon} \\ \cdots & & & \\ w(z-(-R)\Delta_z + P/\Delta_{kz})e^{+j2\pi\varepsilon^P} & w(z-(-R+1)\Delta_z + P/\Delta_{kz})e^{+j2\pi\varepsilon^P} & \cdots & w(z-R\Delta_z + P/\Delta_{kz})e^{+j2\pi\varepsilon^P} \end{bmatrix}$$

*Figure 6*

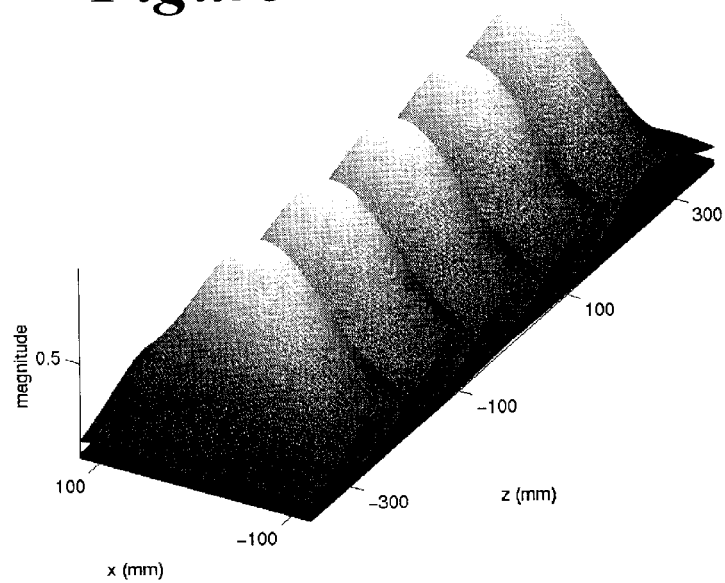
*Figure 7*
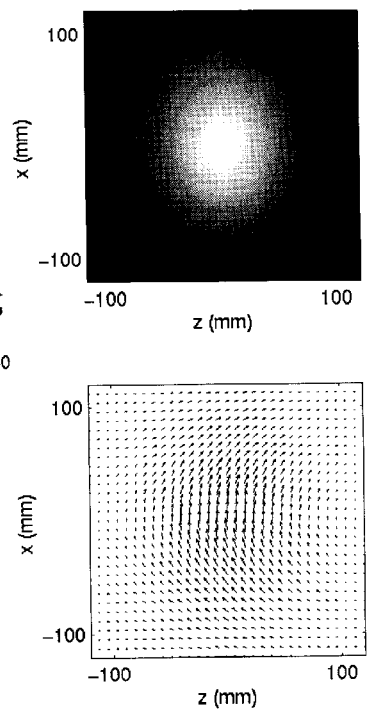
*Figure 8*
*Figure 9*

*Figure 11*
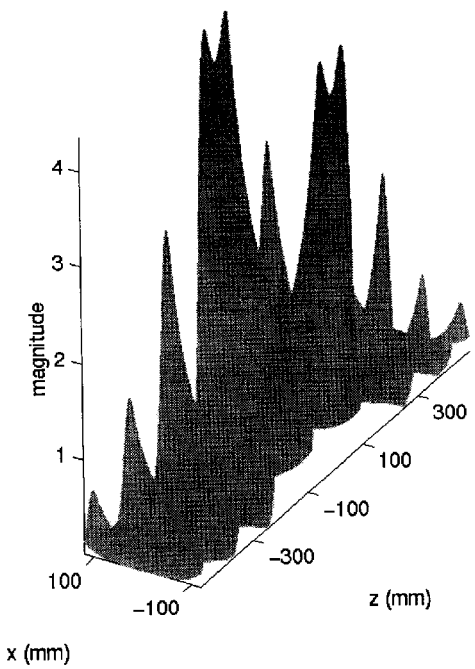
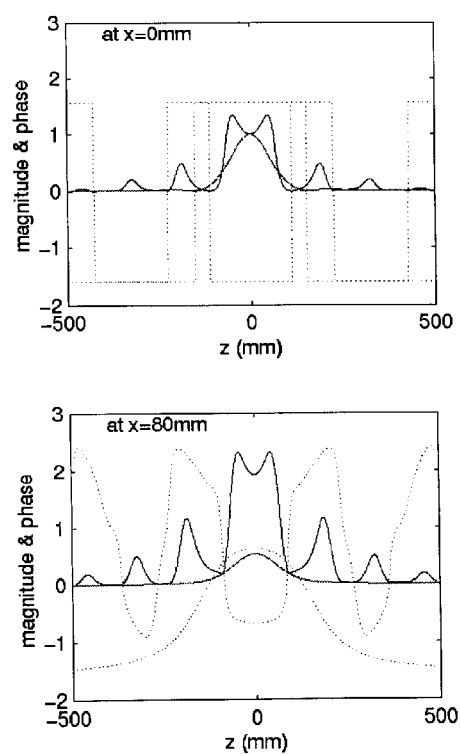
*Figure 10*
*Figure 12*

METHOD FOR MR IMAGING WITH AN ARRAY OF RF COILS

BACKGROUND OF THE INVENTION

This invention relates generally to medical imaging using a Magnetic Resonance Imaging (MRI) system. More particularly, this invention relates to an efficient method for imaging with an array of radiofrequency (RF) coils.

A known MRI technique for increasing imaging speed involves MR data acquisition using an array of RF coils. As is well known to practitioners in the field of MR imaging, RF coil arrays have been developed to overcome certain deficiencies in other types of MR receivers. More specifically, a RF coil array generally provides a MR receiver which generally has better signal to noise ratio than a volume coil receiver, and at the same time does not diminish field of view. Additionally, RF coil arrays have been found to be particularly useful in imaging elongated structures, such as the cervic, thoracic and lumbar regions of the spine.

Generally, integration of the acquired data from the array presents potential reconstruction problems and signal to noise ratio issues. The multiple or regional images reconstructed with data acquired by each of the respective RF coils in the array must be stitched together to form an image of the full field of view. For approaches that use RF coil arrays to reduce number of spatial encoding steps, known techniques of filling up skipped k-space lines based on synthesizing Fourier harmonics and known techniques of resolving localization ambiguities directly with coil sensitivity mapping have been used to reconstruct the full-FOV image. However with these techniques, imaging accuracy, robustness and signal to noise remain issues.

What is needed is an effective method for producing an image of a region of interest using a RF coil array. What is further needed is a method for acquiring and reconstructing image data from an array of RF coils to produce an image of a region of interest.

BRIEF SUMMARY OF THE INVENTION

A method and apparatus for producing an image of a region of interest using a Magnet Resonance Imaging (MRI) system comprises the steps of acquiring a plurality of under-sampled MR data sets from a plurality of radiofrequency (RF) coils forming an array and combining the plurality of under-sampled MR data sets to produce the image. Each of the RF coils has a non-uniform sensitivity.

BRIEF DESCRIPTION OF THE DRAWINGS

The features and advantages of the present invention will become apparent from the following detailed description of the invention when read with the accompanying drawings in which:

FIG. 6 illustrates a matrix useful in deriving the reconstruction weighting function of FIG. 5; and, FIGS. 7–14 are representative illustrations of embodiments of the present invention.

DETAILED DESCRIPTION OF THE PREFERRED EMBODIMENT

Figure 1:
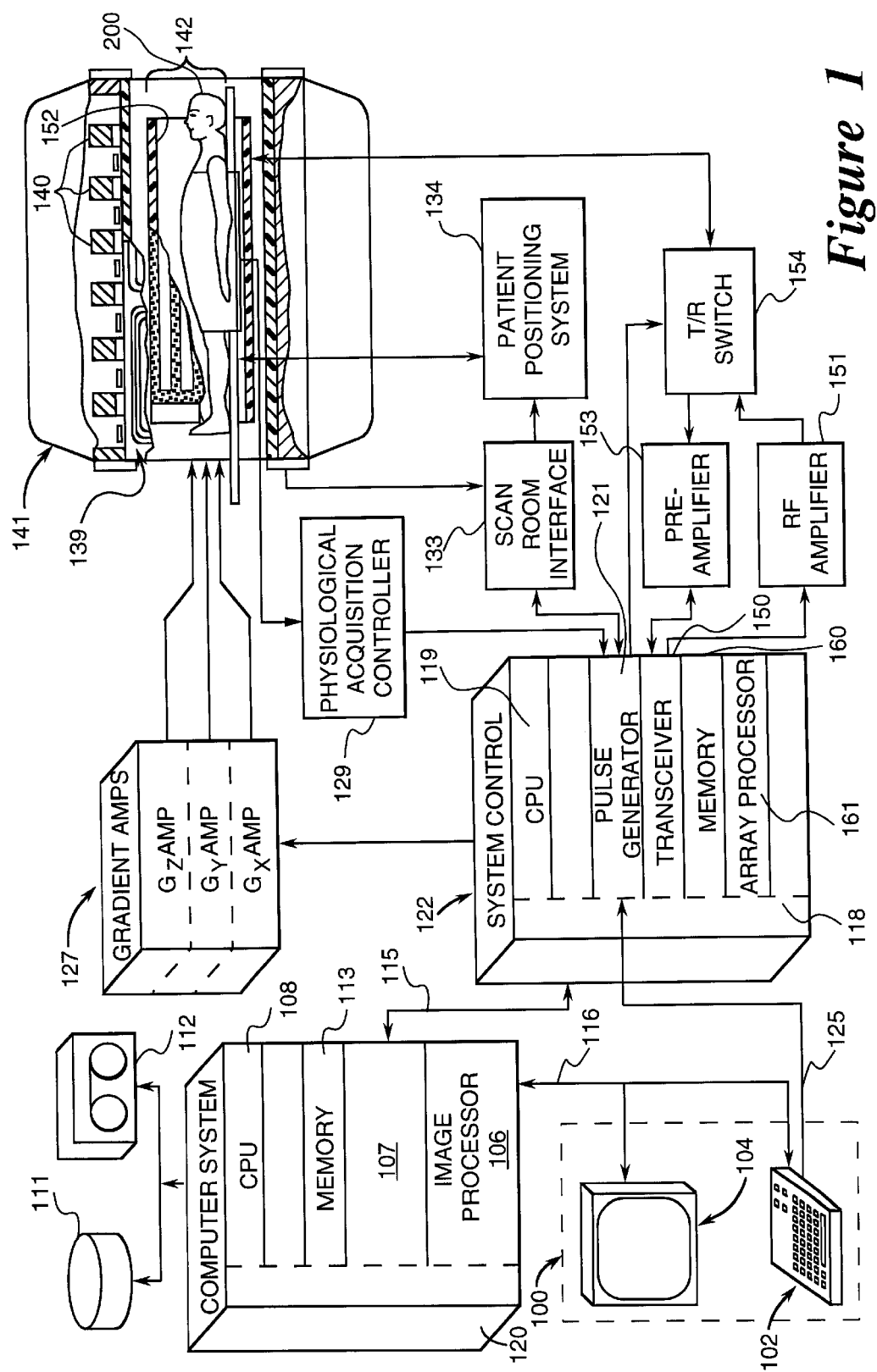
FIG. 1 illustrates a simplified block diagram of a Magnetic Resonance Imaging system to which embodiments of the present invention are useful.

FIG. 1 illustrates a simplified block diagram of a system for producing images in accordance with embodiments of the present invention. In an embodiment, the system is an MR imaging system which incorporates the present invention. The MR system could be, for example, a GE-Signa MR scanner available from GE Medical Systems, Inc., which is adapted to perform the method of the present invention, although other systems could be used as well.

The operation of the MR system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108, and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data that indicate the timing, strength, and shape of the radio frequency (RF) pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives subject data from a physiological acquisition controller 129 that receives signals from a number of different sensors connected to the subject 200, such as ECG signals from electrodes or respiratory signals from a bellows. And finally, the pulse generator module 121 connects to a scan room interface circuit 133 which receives signals from various sensors associated with the condition of the subject 200 and the magnet system. It is also through the scan room interface circuit 133 that a positioning device 134 receives commands to move the subject 200 to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. Volume 142 is shown as the area within magnet assembly 141 for receiving subject 200 and includes a patient bore. As used herein, the usable volume of a MRI scanner is defined generally as the volume within volume 142 that is a contiguous area inside the patient bore where homogeneity of main, gradient and RF fields are within known, acceptable ranges for imaging. A transceiver module 150 in the system control 122 produces pulses that are amplified by a RF amplifier 151 and coupled to the RF coil 152 by a transmit/receive switch 154. The resulting signals radiated by the excited nuclei in the subject 200 may be sensed by the same RF coil 152 and coupled through the transmit/receive switch 154 to a preamplifier 153. The amplified MR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode. RF coil 152 is configured as a receive coil array comprising a plurality of individual receive coils (shown as 250 in FIG. 2) positioned linearly along an orthogonal axis of the MRI system. Alternatively, the individual coils are generalized across a rectangular area. Coils 250 arranged as described are hereinafter collectively denoted as RF coil 152. It is to be appreciated that RF coil 152 is configured to be operable for MRI scanning as described below, the number of RF coils forming the array is selectable based on known MRI imaging methods using RF coil arrays. As used herein, "adapted to", "configured" and the like refer to mechanical or structural connections between elements to allow the elements to cooperate to provide a described effect; these terms also refer to operation capabilities of electrical elements such as analog or digital computers or application specific devices (such as an application specific integrated circuit (ASIC)) that is programmed to perform a sequel to provide an output in response to given input signals.

The MR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. These image data are conveyed through the serial link 115 to the computer system 107 where they are stored in the disk memory 111. In response to commands received from the operator console 100, these image data may be archived on the tape drive 112, or they may be further processed by the image processor 106 and conveyed to the operator console 100 and presented on the display 104. As will be discussed with reference to embodiments below, further processing is performed by the image processor 106 that includes reconstructing acquired MR image data according to embodiments described below. It is to be appreciated that a MRI scanner is designed to accomplish field homogeneity with given scanner requirements of openness, speed and cost.

In an embodiment of the present invention, a method for producing an image of a region of interest using a Magnet Resonance Imaging (MRI) system comprises the steps of acquiring a plurality of under-sampled MR data sets from a plurality of radiofrequency (RF) coils forming an array and combining the plurality of under-sampled MR data sets to produce the image. Each of the RF coils has a non-uniform sensitivity. The coils are configured to acquire the respective MR data sets in parallel. As used herein, a region of interest refers to a region within subject 200 (FIG. 1) that is being examined. The region is either a three-dimensional (3D) volume or alternatively a two-dimensional (2D) plane. The embodiments described herein are applicable to 3D volumes and 2D planes. Generally, a region of interest for purposes of the invention is part of the subject that is being examined.

As used herein, the term "under-sampled" refers to the condition in which a given MR data set is the result of a k-space sampling with density along one or more k axis substantially lower than what is normally required by an aliasing-free scan.

Reconstruction of the image of the volume of interest using the under-sampled MR data sets is performed by weighting and summing aliased regional images in a manner that substantially eliminates aliasing in the image of the full volume of interest. Reconstruction methods useful in embodiments of the present invention are derived as follows.

In a linear array of substantially identical coils positioned along z, suppose $w(z-z_n)$ describes the $n^{th}$ component coil's sensitivity across the imaged volume. Ignoring relaxation, motion and coupling effects, data from the $n^{th}$ coil are expressed as samples of $S_n(k_x, k_y, k_z)$, the Fourier transform of $M(x,y,z)w(z-n\Delta_z)$:

$$S_n(k_x, k_y, k_z) = \int\int\int M(x,y,z)w(z-z_n)e^{-j2\pi(k_x x + k_y y + k_z z)}dxdydz. \quad (1)$$

where $M(x,y,z)$ denotes transverse magnetization prior to gradient driven spatial encoding. As Equation 1 and its transformed form (Parseval's theorem) indicate, the MR signal samples each explores information of $M(x,y,z)$ in a localized space-frequency neighborhood where the energies of $w(z-z_n)$ and $FT\{w^*(z-z_n)\exp(j2\pi(k_x x + k_y y + k_z z))\}$ are concentrated (FT=Fourier transform and *=complex conjugate). This leads to a concept of space-frequency domain sampling, a generalization to conventional MRI's concept of k space sampling (i.e., frequency domain sampling).

Figure 3:
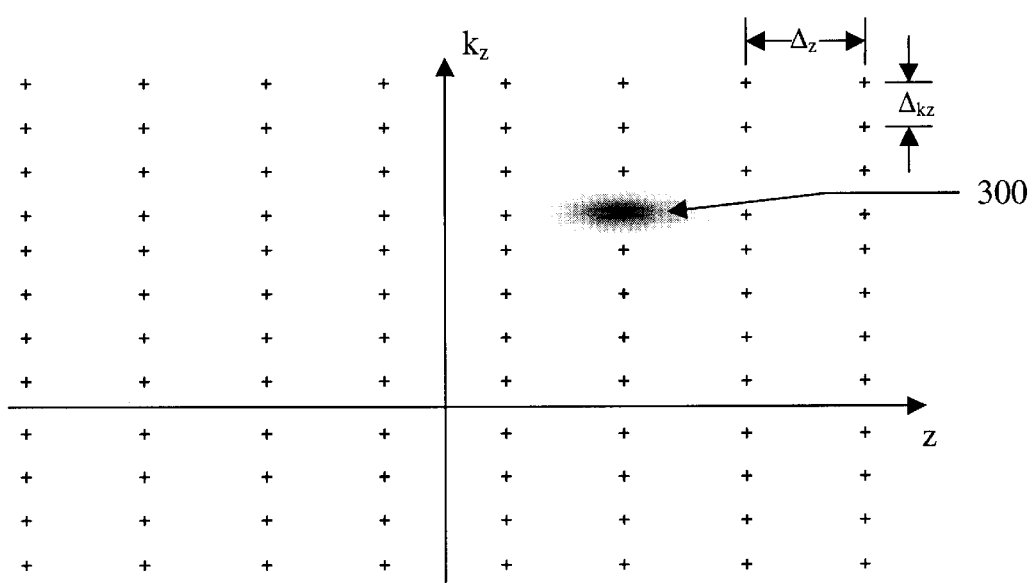
FIG. 3 graphically illustrates a k-space sampling grid useful in embodiments of the invention.

For Equation 1 in particular, a $z-k_z$ plane sampling/coverage perspective is relevant: sensitivity profile w determines the shape of the space-frequency neighborhood, and coil positioning and z-gradient spatial encoding jointly define $z-k_z$ traversing and sampling. FIG. 3 illustrates a rectangular $z-k_z$ sampling grid that is realized with uniform coil positioning and even $k_z$ sampling: $z_n = n\Delta_z$ and $k_z = (m-\epsilon)\Delta_{k_z}$ ($0 \leq \epsilon < 1$ accommodates an offset). The localized space-frequency neighborhood is illustrated at 300.

For this $z-k_z$ sampling, Equation 1 is rewritten as:

$$S_n(k_x, k_y, (m-\epsilon)\Delta_{k_z}) = \int f_{k_x, k_y}(z) g_{m,n}^*(z) dz \quad (2)$$

where $f_{k_x, k_y}(z) = e^{j2\epsilon\pi\Delta_{k_z}z} \int\int M(x,y,z)e^{-j2\pi(k_x x + k_y y)} dxdy$ and $g_{m,n}(z) = e^{j2\pi m\Delta_{k_z}z} w^*(z - n\Delta_z)$.

Developments based on the known frame theory show that if $\{g_{m,n}\}$, a family of weighted Fourier harmonics, constitutes a frame, then $M(x,y,z)$ may be reconstructed substantially without error as:

$$M(x, y, z) = \sum_n M_n(x, y, z) h(z - n\Delta_z) \quad (3)$$

where $h(z)$ is a reconstruction weighting function that is pre-derived from $\Delta_z$, $\Delta_{k_z}$, and $w(z)$, and regional image $M_n(x,y,z)$ is computed as:

$$M_n(x, y, z) = \quad (4)$$

-continued $$\sum_m \left( \int \int S_n(k_x, k_y, (m-\varepsilon)\Delta_{kz})e^{j2\pi(k_x x+k_y y)} dk_x dk_y \right) e^{j2\pi(m-\varepsilon)\Delta_{kz} z}$$

Let $\lambda$ denote the product of $\Delta_{kz}$ and $\Delta_z$. In an example case where w(z) is Gaussian, $\{g_{m,n}\}$ constitutes a frame when $\lambda<1$.

In further embodiments, Equations 3 and 4 are extended to accommodate w's that have x- or y-dependency, leading to consequent x- or y-dependency of the pre-derived h's. A more significant extension lies in the fact that x may be further similarly treated (a planar array of coils and a sampling grid in x–$k_x$–z–$k_z$ hyper-plane).

The space-frequency perspective leads to one key insight on $k_z$ sampling density: $\Delta k_{kz}<1/\Delta_z$ (or equivalently, $\lambda<1$) in the present setup replaces $\Delta_{kz}<1/FOV_z$ ($FOV_z$ stands for z-direction field of view) in a conventional setup as the requirement for gradient-driven z-direction spatial encoding. Compared to conventional MRI targeting the same z-direction field of view and spatial resolution therefore, although the present imaging method's z-gradient must effect the same extent of $k_z$ traversing, sampling density along $k_z$ may be reduced. In the example case of Gaussian sensitivity profile, $\Delta_{kz}<1/\Delta_z$ is a sufficient and necessary condition for resolving M(x,y,z) without aliasing. For a general sensitivity profile that is encountered in practice, the conclusion that $\Delta_{kz}=\lambda/\Delta_z$, $\lambda<1$ suffices for a $FOV_z$ of $N\Delta_z$ with an N-coil array (boundary effect neglected), vs. $\Delta_{kz}=1/(N\Delta_z)$ with a conventional setup using full z-encoding, implies a $\lambda$N-fold reduction of the total number of gradient-driven z-encodes. Equations 3 and 4 define a reconstruction method for M(x,y,z) given z–$k_z$ plane sampling and a selected h function. Reconstruction of the full FOV image in accordance with Equations 3 and 4 requires computing a simple summation of spatially weighted $M_n$(x,y,z)'s, the regional images. Reconstruction of the regional images is desirably carried out in parallel, each, essentially a standard Fourier transform based reconstruction, computed with fast Fourier Transform (FFT). One subtlety is that, rather than the conventional width of $1/\Delta_{kz}$, each regional image's domain of definition along z is ($-\infty$, $+\infty$). Therefore, each FFT result needs to be replicated along z, as far as its corresponding weighting function extends, to form a corresponding regional image. The method of the present invention imposes no restriction on sampling along $k_x$ or $k_y$. In further embodiments, for example, Cartesian or alternatively spiral $k_x$–$k_y$ sampling are used and the results are reconstructed accordingly.

Given $\Delta_z$ and the pre-derived reconstruction weighting h, Equations 3 and 4 allow analysis of the noise propagation from acquired MR data points to reconstructed image pixels. In particular, with knowledge of noise variance/covariance of the MR data, an analytical expression exists that explicitly predicts noise variance/covariance of the reconstructed image as a function of z. Assuming additive white data noise with standard deviation $\sigma_{data}$ for example, it is shown that the noise standard deviation of a pixel at z is:

$$\sigma_{pixel}(z) = \sigma_{data} \frac{\sqrt{\Sigma_n |h(z-n\Delta_z)|^2}}{\sqrt{\text{total number of data points from one coil}}} \quad (5)$$

It follows that at the same spatial resolution and $FOV_z$, when compared to a reference conventional scan (defined as one using a constant sensitivity profile of unit amplitude and gradient-driven z-encodes of $1/FOV_z$ sample spacing), $$\frac{SNR_{multi-coil}}{SNR_{reference}} = \frac{1}{\sqrt{\Sigma_n |h(z-n\Delta_z)|^2} \sqrt{\lambda N}} \quad (6)$$

where $SNR_{multi-coil}$ refers to the signal to noise ratio in the imaging methods of embodiments of the present invention. The term $\sqrt{\lambda N}$, square root of the acceleration factor, appears in the denominator reflecting the intrinsic SNR penalty associated with a $\lambda$N-fold reduction in total scan time. The other term in the denominator, $\sqrt{\Sigma_n |h(z-n\Delta_z)|^2}$, defines the limit at which it is possible to minimize SNR penalty. Its reciprocal is a measure of the system's SNR efficiency. The expression greatly facilitates system design and SNR optimization, which will be discussed in greater detail below.

In the present invention, the reconstruction weighting function h(z) is pre-computed based on $\Delta_z$, $\Delta_{kz}$, and w(z). The following embodiments all target at deriving the reconstruction weighting function h(z) to additionally provide a) a measure of residual aliasing, and b) a capability to flexibly trade off integrity from aliasing for robustness against noise (i.e., to improve signal to noise ratio by controllably accepting some level of residual aliasing).

A first embodiment of deriving reconstruction weighting function h(z) is now described. With the z–$k_z$ plane sampling grid illustrated above, a regional image reconstructed from data collected with coil l (l is the coil index: position of coil l is $l\Delta_z$) is expressed as (x- and y-dependency suppressed for simplicity):

$$M_l(z) = \sum_p w(z - l\Delta_z - p/\Delta_{kz})e^{-j2\pi\varepsilon p} M(z - p/\Delta_{kz}) \quad (7)$$

Assuming ($-R\Delta_z$, $+R\Delta_z$) defines the region outside of which the magnitude of w(z) is negligible. It is noted that only coils n–R, n–R+1, ..., n+R–1 and n+R pick up MR signals that have contributions from spins in region (n$\Delta_z$–$\Delta_z$/2, n$\Delta_z$+$\Delta_z$/2), and hence need be taken into account in the reconstruction of the region. Let the reconstruction be a weighted superposition of aliased images from coils n–R, n–R+1, ..., n+R–1 and n+R:

$$\sum_{l=n-R}^{n+R} h(z - l\Delta_z) M_l(z) = \quad (8)$$

$$\sum_{l=n-R}^{n+R} h(z - l\Delta_z) \sum_{p=-P}^{P} w(z - l\Delta_z - p/\Delta_{kz})e^{-j2\pi\varepsilon p} M(z - p/\Delta_{kz})$$

where P is the minimum integer that is greater or equal to (2R+1/2)$\lambda$. For a weighted superposition of (aliased) regional images, or component-coil images, to accurately reconstruct a full-FOV image, $\Sigma_l h(z-l\Delta_z)M_l(z)$ should match M(z) as closely as possible regardless of M(z)'s shape. The aliased terms in Equation 8 therefore must be substantially negligible in magnitude. This, when expressed in matrix form, translates to Ah=$e_1$, where
h=[h(z–(–R)$\Delta_z$) h(z–(–R+1)$\Delta_z$) ... h(z–R$\Delta_z$)]$^T$,
$e_1$=[1 0 ... 0]$^T$,
and A is a matrix fully defined by $\Delta_z$, $\Delta_{kz}$ and w(z) and is shown in FIG. 6. Solving equation Ah=$e_1$ with least squares for each z location in [0,$\Delta_z$) generates a weighting function.

In effect, for each z location, ∥Ah–$e_1$∥, the norm of the difference between Ah and $e_1$, serves as a measure of residual aliasing level, and should be of insignificant amplitude to ensure accurate reconstruction. Relaxing requirement on $\|Ah-e_1\|$ however, is practically desirable for robustness/SNR considerations. Rather than using a simple least squares as above, the following describe two embodiments which derive h for less signal to noise (SNR) penalty while maintaining control over reconstruction accuracy.

A first embodiment for deriving h seeks a desired balance between residual aliasing and image SNR. It is primarily applicable when reconstruction operates in a regime where $\lambda=\Delta_{kz}\Delta_z>1$ and reconstruction without aliasing is not possible. In this case, h is desirably derived to minimize $\|Ah-e_1\|+\alpha\|h\|$, where $\alpha$ is a weighting reflecting relative interest on maximum signal-to-noise ratio (SNR) versus minimum residual aliasing. This derivation is formulated and solved as a least squares problem.

A second embodiment for deriving h seeks to maximize SNR within the confinement of a chosen upper limit on residual aliasing level, reflecting a prioritization on imaging accuracy control. It is primarily applicable when reconstruction operates in a regime where $\lambda=\Delta_{kz}\Delta_z\leq 1$ and reconstruction without aliasing is realizable. It is known that as $\lambda$ approaches 1 or as the $z-k_z$ plane sampling neighborhood assumes an extremely elongated shape, reconstruction robustness and SNR degrades. In the case of Gaussian profile, numerical stability of a reconstruction that strives for minimum aliasing worsens drastically when $\lambda$ goes beyond 0.996. This second embodiment formulates the derivation of h as a problem of finding the h that minimizes $\|h\|$ subject to $\|Ah-e_1\|<\tau$, where $\tau$ is a scalar representing a maximum level of tolerable residual aliasing. Singular value decomposition suggests itself as a powerful numerical tool. Let $U\Sigma V^*$ denote the singular value decomposition of matrix A, where U and V are orthogonal matrices and $\Sigma$ is a diagonal matrix with $\sigma_j$'s, the singular values of A, on the diagonal. A standard minimum norm solution is found by computing $V\Sigma^{554} U^*e_1$, where $\Sigma^\dagger$ is the result of transposing $\Sigma$ and replacing each of the non-zero $\sigma_j$'s with its reciprocal. In the present embodiment, a threshold $\rho$ is chosen, each of the $1/\sigma_j$'s in $\Sigma^\dagger$ is set zero whenever $\sigma_j\leq\rho$, and then $V\Sigma^\dagger U^*e_1$ is computed. The result effectively minimizes image noise standard deviation for a certain residual aliasing level. The flexibility in trading off reconstruction accuracy for lower image noise is appreciated by noting the property that, if $\rho_1\leq\rho_2$, then $\tau_1\leq\tau_2$ but $\|h_1\|\geq\|h_2\|$. The rational behind the method include: a) the more zeros these $1/\sigma_j$'s are replaced with, the smaller the norm of $V\Sigma^\dagger U^*e_1$, the solution for h, and typically the larger the norm of the error (residual aliasing level), and b) $\sqrt{\Sigma_n|h(z-n\Delta_z)|^2}=\|h\|$.

Finally it can be shown that a useful scaling property holds. If h(z) denotes optimum reconstruction weighting function derived for a given $\{w(z), \Delta_z$ and $\Delta_{kz}\}$ set using the methods described earlier, then for $\{w(\beta z), \beta\Delta_z$ and $\Delta_{kz}/\beta\}$, the optimum weighting is $h(\beta z)$.

A further alternative embodiment for deriving h adapts the known technique of dual frames.

Figure 5:
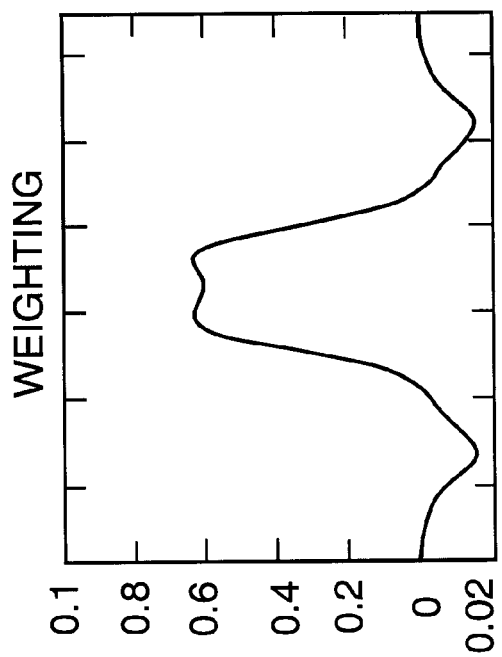
FIG. 5 graphically illustrates a reconstruction weighting function useful in embodiments of the present invention.
Figure 4:
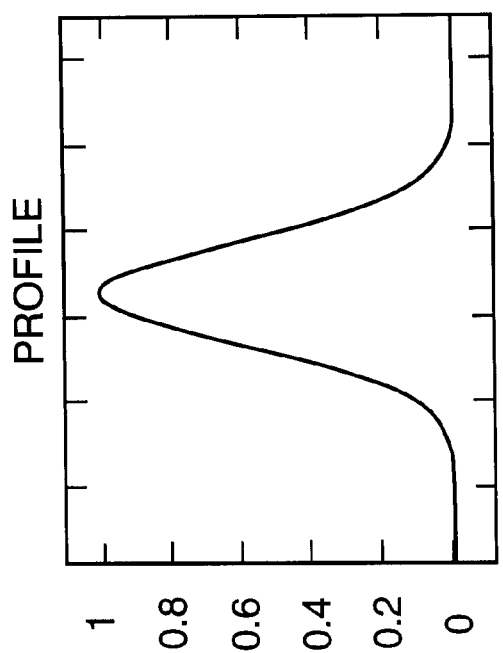
FIG. 4 graphically illustrates a RF coil sensitivity profile useful in embodiments of the present invention.

Referring to FIG. 4, there is shown a representative sensitivity profile. Referring to FIG. 5, there is shown an illustration of a corresponding weighing h(z).

Figure 13:
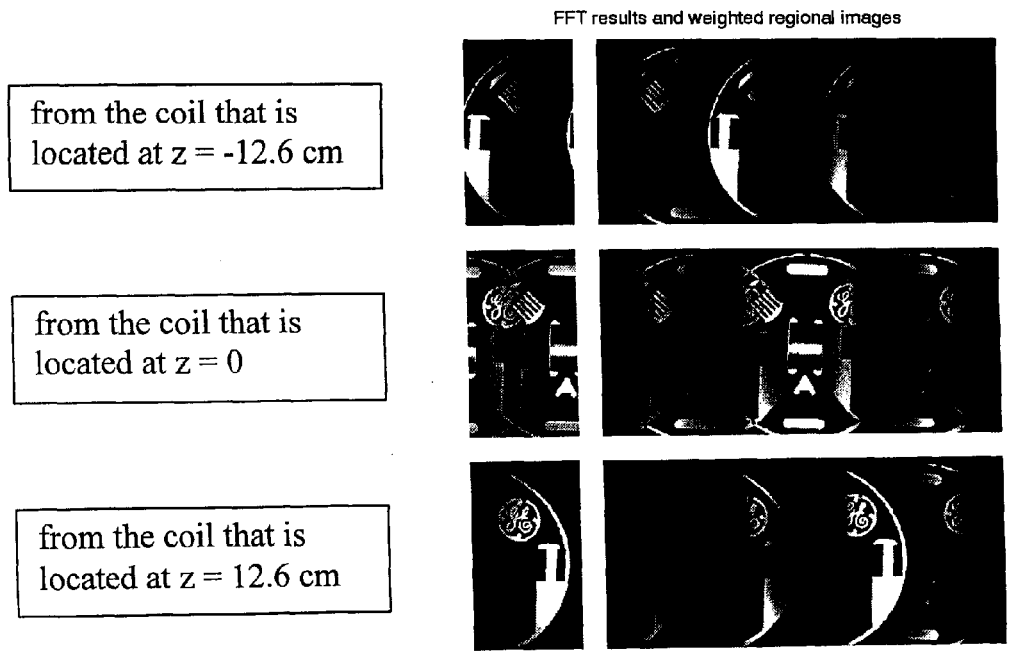
Figure 14:
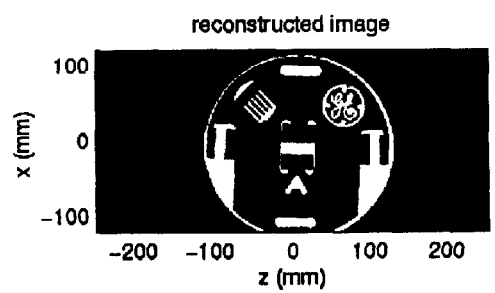

Referring to FIGS. 7–14, there is shown a representative case where each coil's sensitivity profile has dependency on both z and x. Imaging on a plane 10 cm above an array of circular loop coils (diameter=10 cm, aligned along z) is illustrated. FIGS. 8 and 9 show respectively the magnitude and phase of the sensitivity profile of one component coil. FIG. 7 shows the magnitude of the sensitivity profiles of an array of 5 circular loop coils. In an example case where the acceleration factor is $0.9N_{coil}$ and $\Delta_z=12.6$ cm, the second embodiment for deriving h described above calculated the h(x,z) (a complex-valued function of x and z and $\tau\sim 10^{-4}$, whose magnitude and phase is shown in FIGS. 10–12 (with solid lines representing magnitude and dotted lines representing phase). Application of the coil array and the derived h function for imaging a 24×51 cm$^2$ region with isotropic 1 mm spatial resolution is illustrated in FIGS. 13 and 14: regional images from 3 of the total of 5 coils are shown in FIG. 13 (2D FFT of raw data, replication and weighting by h(x,z)) and the full-FOV image reconstructed by superposition of 5 regional images is shown in FIG. 14.

Figure 2:
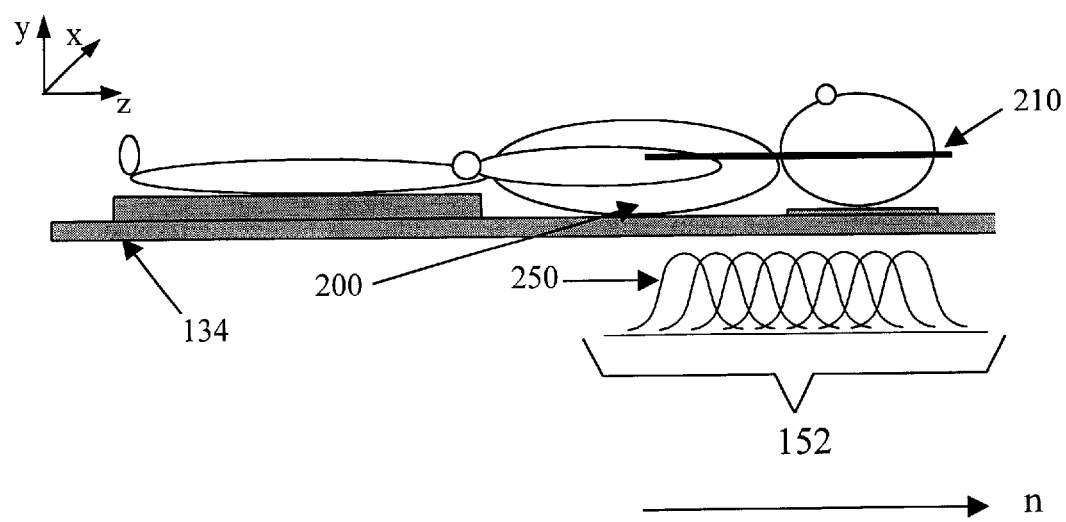
FIG. 2 is a diagram showing aspects of a MRI system for use in connection with embodiments of the invention.

In a further embodiment, there is provided an imaging apparatus for producing Magnetic Resonance (MR) images of a subject having a magnet assembly for producing a static magnetic field and a gradient coil assembly disposed within the magnet assembly for generating a magnetic field gradient for use in producing MR images comprising a plurality of radiofrequency (RF) coils forming an array and a processor for combining respective MR data sets from the array to produce the image. In this embodiment, the MRI system shown in FIG. 1 includes the plurality of RF coils forming the array. Referring to FIG. 1, RF coil 152 is configured as an array of individual coils arranged linearly as illustrated in FIG. 2 (coils 250, shown as sensitivity profiles in FIG. 2, arranged along a line to form RF coil 152). Each of RF coils 250 has a non-uniform sensitivity and the sensitivity profiles of adjacent coils overlap, as illustrated in FIG. 2. The gradient along the axis of coil alignment effects undersampling along a corresponding k axis. Thus, the MR data sets acquired from the array are under-sampled MR data sets. Further in this embodiment, processor 106 of FIG. 1 is configured to combine the acquired MR data sets to produce the image of the region of interest in accordance with the embodiments described above with reference to pre-deriving a reconstruction weighting function, and to Fourier transforming, replicating, weighting and summing under-sampled MR data sets acquired by a plurality of RF coils forming an array.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A method for producing an image of a region of interest using a Magnet Resonance Imaging (MRI) system comprising:
   acquiring a plurality of under-sampled Magnetic Resonance (MR) data sets from an array of radiofrequency (RF) coils in said MRI system, each of said RF coils having a non-uniform sensitivity profile; and,
   reconstructing a plurality of regional images from said acquired plurality of under-sampled MR data sets, said reconstructing of each respective regional image being performed substantially simultaneously with one another; and,
   weighting and summing said respective regional images to produce said image of said region of interest.

2. The method of claim 1 wherein each of said regional images is aliased and the weighting and summing step substantially eliminates aliasing in said image of said region of interest.

3. The method of claim 1 wherein said RF coils in said array are arranged linearly relative to each other.

4. The method of claim 1 wherein said region of interest is a three-dimensional volume.

5. The method of claim 1 wherein said region of interest is a two-dimensional plane.

6. The method of claim 1 wherein the reconstructing step is performed in accordance with:

$$M(x, y, z) = \sum_n M_n(x, y, z) h(z - n\Delta_z)$$

and $$M_n(x, y, z) = \sum_m \left( \int \int S_n(k_x, k_y, (m-\varepsilon)\Delta_{k_z}) e^{j2\pi(k_x x + k_y y)} dk_x dk_y \right) e^{j2\pi(m-\varepsilon)\Delta_{k_z} z}$$

where h(z) is a reconstruction weighting function that is pre-derived from $\Delta_z$, $\Delta_{k_z}$, and w(z), w(z) being the non-uniform sensitivity profile.

7. The method of claim 6 wherein h(z) is derived in accordance with singular value decomposition techniques that minimize $\|h\|$ subject to $\|Ah - e_1\| < \tau$, where $\tau$ is a scalar representing a maximum level of tolerable residual aliasing.

8. An imaging apparatus for producing Magnetic Resonance (MR) images of a subject having a magnet assembly for producing a static magnetic field and a gradient coil assembly disposed within said magnet assembly for generating a magnetic field gradient for use in producing MR images, said apparatus comprising;

a plurality of radiofrequency (RF) coils forming an array and said RF coils having overlapped non-uniform sensitivity profiles and acquiring in parallel under-sampled Magnetic Resonance (MR) data sets;

a processor for combining said plurality of under-sampled MR data sets to produce said image by reconstructing a plurality of regional images from said plurality of under-sampled MR data sets, said reconstructing of each respective regional image being performed substantially simultaneously with one another, and weighting and summing said respective regional images to produce said image of said region of interest.

9. The apparatus of claims 8 wherein said processor reconstructs a plurality of aliased regional images corresponding to said plurality of under-sampled MR data sets.

10. The apparatus of claim 8 wherein said processor combines said aliased regional images by weighting and summing such that said image of the region of interest is substantially free of aliasing artifacts.

* * * * *